(12) United States Patent
Numata

(10) Patent No.: US 6,344,513 B1
(45) Date of Patent: Feb. 5, 2002

(54) RESIN COMPOSITION AND JIG FOR USE IN TRANSPORTATION

(75) Inventor: Takayoshi Numata, Chiba (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 09/674,081

(22) PCT Filed: Feb. 25, 2000

(86) PCT No.: PCT/JP00/01110
§ 371 Date: Oct. 26, 2000
§ 102(e) Date: Oct. 26, 2000

(87) PCT Pub. No.: WO00/50514
PCT Pub. Date: Aug. 31, 2000

(30) Foreign Application Priority Data

Feb. 26, 1999 (JP) ............................................. 11-050175

(51) Int. Cl.$^7$ ................................................. C08K 3/03
(52) U.S. Cl. ....................................... 524/496; 524/495
(58) Field of Search ................................. 524/495, 496

(56) References Cited

U.S. PATENT DOCUMENTS

| | | |
|---|---|---|
| 4,579,902 A | 4/1986 | O'Brien |
| 5,780,127 A | 7/1998 | Mikkelsen |

FOREIGN PATENT DOCUMENTS

| | | |
|---|---|---|
| JP | 11-71507 | 3/1999 |
| JP | 11-71508 | 3/1999 |
| JP | 11-315208 | 11/1999 |
| WO | 9423433 | 10/1994 |

OTHER PUBLICATIONS

International Search Report.

*Primary Examiner*—Edward J. Cain
(74) *Attorney, Agent, or Firm*—Sughrue Mion, PLLC

(57) ABSTRACT

A resin composition exhibiting excellent antistaticity and static charge dissipating performance and having extremely small variations of antistatic properties (saturated static voltage and half-life period of static voltage) on the surface of a molded article and a transportation jig for electronic field made of the above resin composition are provided by using a resin composition produced by compounding (A) 100 parts by weight of a thermoplastic resin with (B) 1 to 30 parts by weight of a carbon fiber having a diameter of 1 nm to 1 $\mu$m, a length of 1 $\mu$m to 3 mm and a volume resistivity of smaller than 1 $\Omega$cm and (C) 5 to 200 parts by weight of an antistatic polymer having a surface resistivity of $10^8$ to $10^{11}\Omega$ (measured under impressed voltage of 500V), a melting point of 100° C. or above, an apparent melt viscosity of 10 to 1,000 Pa·s at apparent shear rate of 1,000 sec$^{-1}$ at 260° C. and an apparent melt viscosity ratio of the antistatic polymer to the thermoplastic resin of 0.01 to 1.3 under the above condition.

11 Claims, 1 Drawing Sheet

Gate side

RESIN COMPOSITION AND JIG FOR USE IN TRANSPORTATION

TECHNICAL FIELD

The present invention relates to a resin composition giving a molded article having small shrinkage anisotropy, resistant to accumulation of static charge and exhibiting excellent static charge dissipation property to quickly attenuate the electrostatic voltage in case of accumulating static charge and a transportation jig made thereof, especially a silicon wafer carrier.

BACKGROUND ARTS

It is known that a thermoplastic resin composition can be imparted with antistaticity by compounding a low-molecular antistatic agent such as an alkylsulfonic acid phosphonium salt or compounding a high-polymer antistatic agent such as a polyether ester amide. Although the initial antistatic effect is high in the case of compounding a low-molecular antistatic agent, the performance is lowered by the variation of environment and the antistaticity is eliminated by wiping or washing. On the other hand, the application of the process for compounding a high-polymer antistatic agent to an engineering plastic such as polyester often causes insufficient heat-resistance and melt stability and it is difficult to attain a saturated static voltage of 1 KV or below and a half-life period of static voltage of 10 sec or shorter (impressed voltage: 10 KV) simply by increasing the compounding amount of the agent. Even if such performance can be achieved, the other physical properties are deteriorated and a problem arises in productivity.

Another known method for imparting a thermoplastic resin with antistaticity is the compounding of carbon fiber (JP-A 8-88266). The resistivity and saturated static voltage can be decreased by increasing the compounding amount of carbon fiber in the case of exclusive compounding of carbon fiber, however, it is difficult to decrease the half-life period of static voltage to 10 seconds or shorter (impressed voltage: 10 KV).

Satisfactory results are attained on the above-mentioned characteristics by compounding a carbon fiber or a stainless steel fiber in combination with a conductive filler or powder having extremely small aspect ratio, however, the composition is unsuitable as a transportation jig in the field of electronics since conductive powder dust is generated in the molding of the composition. Furthermore, the control of the surface resistivity of antistatic level is difficult in the system.

DISCLOSURE OF THE INVENTION

When a silicon wafer carrier is formed with a resin composition produced by simply adding a high-polymer antistatic agent to a thermoplastic resin, sufficient antistatic performance cannot be attained in spite of desirable results comprising suppressed lowering of antistaticity in washing stage and low contamination of the silicon wafer with dissolved metal.

The integration degree of integrated circuit is increasing day by day to decrease the particle size causing static hazard on a silicon wafer for integrated circuit and, accordingly, the present antistatic performance (surface resistivity: $10^{12}$ to $10^{13}\Omega$) became insufficient.

When a resin composition compounded with a low-molecular antistatic agent is used as a transportation jig in electronic field, a large amount of dissolved metal is generated in washing stage, etc., and the metal is attached to the silicon wafer to cause the crystal defect and the deterioration of electric characteristics of the device.

A thermoplastic resin compounded with carbon fiber (which may be abbreviated as CF hereinafter) cannot cope with varied forms of the transportation jigs and it is sometimes difficult, dependent on the form of the transportation jig, to attain stable electric conductivity even by mixing a large amount of CF, supposedly owing to the poor dispersibility of CF. Furthermore, the compounding of CF results in the generation of shrinkage anisotropy of the molded article caused by the orientation of CF and is unsuitable for a transportation jig required to have accurate dimensions.

A resin compounded with a carbon black, e.g. with 7% by weight of ketjenblack not only generates large amount of conductive powder dust but also causes the remarkable deterioration of mechanical properties and the use of the composition as a transportation jig is impossible.

The object of the present invention is to solve the above-mentioned problems of conventional techniques.

A concrete object of the present invention is to provide a resin composition having desirable and permanent antistaticity, exhibiting excellent static charge dissipating performance and having extremely small variations of antistatic properties (saturated static voltage and half-life period of static voltage) on the surface of a molded article.

Another object of the present invention is to provide a transportation jig for electronic field made of a resin composition having excellent static charge dissipating performance, giving uniform and excellent antistaticity on the surface of a transportation jig and having small shrinkage anisotropy.

Still further objects and advantages of the present invention will become apparent by the following explanation.

The present invention comprises a resin composition produced by compounding (A) 100 parts by weight of a thermoplastic resin with (B) 1 to 30 parts by weight of a carbon fiber having a diameter of 1 nm to 1 $\mu$m, a length of 1 $\mu$m to 3 mm and a volume resistivity of smaller than 1 $\Omega$cm and (C) 5 to 200 parts by weight of an antistatic polymer having a surface resistivity of $10^8$ to $10^{11}\Omega$ (measured under impressed voltage of 500V), a melting point of 100° C. or above, an apparent melt viscosity of 10 to 1,000 Pa·s at apparent shearing rate of 1,000 sec$^{-1}$ at 260° C. and an apparent melt viscosity ratio of the antistatic polymer to the thermoplastic resin of 0.01 to 1.3 under the above condition.

The present invention further comprises a transportation jig for electronic field, especially a silicon wafer carrier, made of the above resin composition.

The transportation jig means, e.g. a silicon wafer carrier, a silicon wafer cassette, a silicon wafer carrier box, a silicon wafer pressing rod, an IC tray, a carrier for transportation of liquid crystal substrate and transportation jig for HDD and LCD-relating parts.

The present invention will be described in detail as follows.

<Thermoplastic Resin>

The thermoplastic resin (A) is, for example, a thermoplastic polyester, a polyolefin, a polycarbonate, an acrylic resin, a thermoplastic polyurethane resin, a polyvinyl chloride, a fluororesin, a polyamide, a polyacetal, a polysulfone, a polyphenylene sulfide, a polyether ether ketone or a styrene resin, preferably a thermoplastic polyester.

The thermoplastic polyester of the thermoplastic resin (A) is composed of a dicarboxylic acid component and a diol component. The dicarboxylic acid component is, for example,, terephthalic acid and 2,6-naphthalenedicarboxylic acid. Examples of the diol component are ethylene glycol, trimethylene glycol, tetramethylene glycol, hexamethylene glycol and neopentyl glycol.

The thermoplastic polyester of the thermoplastic resin (A) is preferably polybutylene terephthalate, polypropylene terephthalate, polyethylene terephthalate, polybutylene-2,6-naphthalenedicarboxylate or polyethylene-2,6-naphthalenedicarboxylate, especially preferably polybutylene terephthalate from the viewpoint of high crystallization rate.

The thermoplastic polyester of the thermoplastic resin (A) may be copolymerized with a copolymerization component in an amount of 30 mol % or less, preferably 20 mol % or less and further preferably 10 mol % or less based, on the total dicarboxylic acid component.

Examples of such copolymerization component are aromatic dicarboxylic acid, e.g. terephthalic acid, isophthalic acid and phthalic acid; alkyl-substituted phthalic acids such as methylterephthalic acid and methylisophthalic acid; naphthalenedicarboxylic acids such as 2,6-naphthalenedicarboxylic acid, 2,7-naphthalenedicarboxylic acid and 1,5-naphthalenedicarboxylic acid; diphenyldicarboxylic acids such as 4,4'-diphenyldicarboxylic acid and 3,4'-diphenyldicarboxylic acid; and diphenoxyethane dicarboxylic acids such as 4,4'-diphenoxyethane dicarboxylic acid; aliphatic or alicyclic dicarboxylic acids such as succinic acid, adipic acid, sebacic acid, azelaic acid, decanedicarboxylic acid and cyclohexanedicarboxylic acid; alicyclic diols such as 1,4-cyclohexane dimethanol; aromatic diols e.g. dihydroxybenzenes such as hydroquinone and resorcinol; bisphenols such as 2,2'-bis(4-hydroxyphenyl)-propane and bis(4-hydroxyphenyl)-sulfone and ether diols derived from bisphenols and a glycol such as ethylene glycol; and oxycarboxylic acids such as $\epsilon$-oxycaproic acid, hydroxybenzoic acid and hydroxyethoxybenzoic acid.

The thermoplastic polyester of the thermoplastic resin (A) may be copolymerized with a polyfunctional ester-forming acid such as trimesic acid and trimellitic acid or a polyfunctional ester-forming alcohol such as glycerol, trimethylolpropane and pentaerythritol as a branching component. The copolymerizing amount is 1.0 mol % or below, preferably 0.5 mol or below and more preferably 0.3 mol % or below based on the total dicarboxylic acid component.

The thermoplastic polyester of the thermoplastic resin (A) preferably has an intrinsic viscosity of 0.6 to 1.2. When the intrinsic viscosity is smaller than 0.6, sufficient mechanical characteristics cannot be attained and when it exceeds 1.2, the moldability is deteriorated owing to the increased melt viscosity and lowered fluidity. The intrinsic viscosity is a value calculated from the viscosity measured in o-chlorophenol at 35° C.

The polyolefin of the thermoplastic resin (A) is, for example, a polypropylene or a polyethylene.

Example of the acrylic resin of the thermoplastic resin (A) is polymethyl methacrylate.

The polycarbonate (which may be abbreviated as PC hereinafter) of the thermoplastic resin (A) is, for example, a polymer produced by reacting e.g. bisphenol A with diphenyl carbonate in molten state.

The polyether ether ketone (which may be abbreviated as PEEK hereinafter) of the thermoplastic resin (A) is, for example, a polymer produced by reacting e.g. 4,4'-difluorobenzophenone with hydroquinone and diphenylsulfone (solvent).

In addition to the above, polymers and/or copolymers containing at least one kind of unit selected from a group consisting of styrenes, (meth)acrylic acid esters, (meth) acrylonitrile and butadiene as constituent unit may be used as the thermoplastic resin (A). Examples of the styrenes are styrene and substituted styrenes such as methylstyrene.

Examples of such polymers and/or copolymers are polystyrene, styrene/acrylonitrile copolymer, acrylonitrile/butadiene/styrene copolymer, methyl methacrylate/butadiene/styrene copolymer, methyl methacrylate/ethyl methacrylate/butadiene/styrene copolymer and styrene/methyl methacrylate/acrylonitrile copolymer. Preferable polymers among the above examples are polystyrene, polymethyl methacrylate, styrene/acrylonitrile copolymer, acrylonitrile/butadiene/styrene copolymer, methyl methacrylate/butadiene/styrene copolymer and styrene/methyl methacrylate/acrylonitrile copolymer.

<Carbon Fiber>

Carbon fibers (B) having a diameter of 1 nm to 1 $\mu$m, a length of 1 $\mu$m to 3 mm and a volume resistivity of smaller than 1 $\Omega$cm are used in the present invention. The diameter of the carbon fiber (B) is preferably 1 nm to 500 nm.

When the diameter of the carbon fiber (B) is smaller than 1 nm, the carbon fibers are dispersed in the form of too fine fibers to attain the objective antistaticity. When the diameter exceeds 1 $\mu$m, deviation is generated in the dispersed state of the fiber to fail in getting the synergistic effect of the carbon fiber and the antistatic polymer and antistaticity cannot be imparted to the molded article. When the length of the carbon fiber is shorter than 1 $\mu$m, the carbon fibers are dispersed in the form of too fine fibers to impart a molded article with antistaticity, and when the length exceeds 3 mm, deviation is generated in the dispersed state of the fiber to fail in getting the synergistic effect of the carbon fiber and the antistatic polymer and antistaticity cannot be imparted to the molded article. In the latter case, problems such as deformation are liable to occur by the increase in the shrinkage anisotropy of the molded article. When the volume resistivity of carbon fiber is 1 $\Omega$cm or above, the synergistic effect of carbon fiber and antistatic polymer is unattainable and a surface resistivity of $10^5$ to $10^{12}$ $\Omega/cm^2$ on the surface of the molded article cannot be achieved.

The carbon fiber (B) is preferably a vapor-grown carbon fiber produced by vapor-phase process. The method for producing a vapor-grown carbon fiber is e.g. a substrate method (method described in the specification of JP-A 60-27700) and a flotation method (method described in the specification of JP-A 62-78217). The carbon fibers produced by these methods include carbon fibers treated at a high temperature of 2000° C. or above. Plural kinds of carbon fibers may be used in combination.

The compounding amount of the carbon fiber (B) is 1 to 30 parts by weight, preferably 1 to 15 parts by weight based on 100 parts by weight of the thermoplastic resin (A). When the amount is less than 1 part by weight, there is no development of the synergistic effect of carbon fiber and antistatic polymer to give insufficient leakage of the accumulated charge when the resin is used as a molded article. On the contrary, the surface resistivity of $10^5$ to $10^{12}$ $\Omega/cm^2$ cannot be achieved when the amount exceeds 30 parts by weight. Furthermore, the cost of the resin composition is increased to an unpractical level.

The characteristic feature of the present invention is the combined use of a carbon fiber (B) especially having a diameter of 1 nm to 1 $\mu$m, a length of 1 $\mu$m to 3 mm and a volume resistivity of smaller than 1 $\Omega$cm with an antistatic polymer (C) to remarkably promote the leakage of static charge on the surface of a molded article containing the components and, at the same time, suppress the shrinkage anisotropy and reduce the deformation of the molded article.

<Antistatic Polymer>

An antistatic polymer having a surface resistivity of $10^8$ to $10^{11}\Omega$ is used as the antistatic polymer (C). The surface resistivity is a value measured under an impression voltage of 500V.

Furthermore, the antistatic polymer (C) has an apparent melt viscosity of 10 to 1,000 Pa·s measured at 260° C. under an apparent shear rate of 1,000 sec$^{-1}$, and the ratio of the apparent melt viscosity of the polymer to that of the thermoplastic resin (A) measured under the same condition is from 0.01 to 1.3.

In the present invention, the thermoplastic resin (A) and the antistatic polymer (C) have low compatibility with each other and different melt viscosity characteristics, and the antistatic polymer can be dispersed in the surface layer of a molded article (the phase of the thermoplastic resin (A) extending from the surface to the depth of about 20 μm) in a state to develop desirable leakage of electric charge, that is, in the form of stripes, mesh or spots, by using a combination satisfying the above conditions on the melt viscosity.

When the antistatic polymer (C) takes a stripe-pattern distribution in the phase of the thermoplastic resin (A), the antistatic polymer (C) is preferably distributed in the phase of the thermoplastic resin (A) within the range from the surface to the depth of about 20 μm in the form of an antistatic polymer phase having an aspect ratio of 3 or more and a minor diameter of 1 μm or below or a major diameter of 1 μm or above.

Intersection points between the ultrafine carbon fiber (B) and the antistatic polymer (C) are formed in the molded article by using a combination of the components having melt viscosity values satisfying the above conditions and denser conduction paths are formed by the intersection points to impart the resin composition with extremely excellent antistatic performance.

When the above conditions on the melt viscosity are not fulfilled, there is no formation of the continuous phase of the antistatic polymer (C) and, accordingly, sufficient intersection between the ultrafine carbon fiber (B) and the antistatic polymer (C) cannot be formed to fail in getting a desirable antistatic performance.

The antistatic polymer (C) has a melting point of 100° C. or above. An antistatic polymer having a melting point of lower than 100° C. has insufficient heat-resistance in the case of compounding with engineering plastics such as a polyester and a sufficient antistaticity cannot be attained in the form of a molded article.

The antistatic polymer (C) is preferably a polyether ester amide, a polyether ester block copolymer, a polyethylene glycol methacrylate copolymer, a poly(ethylene oxide/propylene oxide) copolymer and a poly(epichlorohydrin/ethylene oxide) copolymer.

The polyether ester amide of the antistatic polymer (C) can be used together with a polyethylene glycol-based polyester amide and a polyethylene glycol-based polyamide copolymer, especially preferably a polyether ester amide derived (polymerized) from a polyamide (C1) having carboxyl groups on both terminals and an ethylene oxide adduct of bisphenol (C2).

In the case of using such polyether ester amide, the number-average molecular weight of the polyamide (C1) having carboxyl groups on both terminals is preferably 500 to 5,000, more preferably 500 to 3,000. When the number-average molecular weight is smaller than 500, the heat-resistance of the polyether ester amide itself is lowered and, when the molecular weight exceeds 5,000, the reactivity is lowered to increase the production cost of the polyether ester amide to an undesirable level. The number-average molecular weight of the ethylene oxide adduct of bisphenol (C2) is preferably 1,600 to 3,000, more preferably 32 to 60 in terms of the molar number of ethylene oxide. The antistaticity is insufficient when the number-average molecular weight is smaller than 1,600 and the reactivity is lowered to increase the production cost of the polyether ester amide to an undesirable level when the molecular weight exceeds 3,000.

The polyether ester amide can be produced by conventional methods. An example of the process for producing a polyether ester amide is the reaction of an amide-forming monomer with a dicarboxylic acid to form a polyamide (C1) having carboxyl groups on both terminals, the addition of an ethylene oxide adduct of bisphenol (C2) to the polyamide and the polymerization of the addition product under high temperature and reduced pressure conditions.

A polyethylene glycol-based polyester elastomer, especially preferably the following polyether ester block copolymer can be used as the polyether ester block copolymer of the antistatic polymer (C).

The preferable polyether ester block copolymer is composed of the following components (C3), (C4) and (C5).

(C3) A dicarboxylic acid component composed of 60 to 100 mol % of terephthalic acid component and 40 to 0 mol % of isophthalic acid component based on the total acid component;

(C4) A poly(alkylene oxide) glycol component expressed by the following general formula (I)

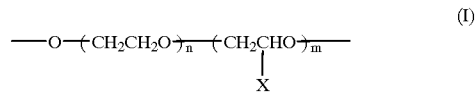

(wherein X is a substituent selected from —H, —CH$_3$, —CH$_2$Cl, —CH$_2$Br, —CH$_2$I and —CH$_2$OCH$_3$; n and m satisfy the formulas n≧0, m≧0 and 120≧(n+m)≧20; X groups may be same or different when m is 2 or over; the poly(alkylene oxide) glycol component may be a random copolymer or a block copolymer by itself); (C5) a glycol component composed of 65 to 100 mol % of tetramethylene glycol and 35 to 0 mol % of ethylene glycol based on the total glycol component (excluding the component (C4)).

In the polyether ester block copolymer composed of the above components, the amount of the component (C4) is preferably 40 to 80% by weight based on the total glycol component (including the component (C4)) and that of the tetramethylene glycol component is preferably 65 mol % or more based on the total glycol component (excluding the component (C4)). Good moldability can be attained by the use of the above composition.

The polyether ester block copolymer may be copolymerized with a dicarboxylic acid other than terephthalic acid and isophthalic acid, for example, phthalic acid, adipic acid, sebacic acid, azelaic acid dodecanediacid, trimellitic acid, pyromellitic acid, naphthalenedicarboxylic acid or cyclohexanedicarboxylic acid as the acid component.

In the case of copolymerizing the above components, the copolymerizing amount is preferably less than 40 mol %, more preferably less than 20 mol % based on the total acid component.

The polyether ester block copolymer may be copolymerized with a diol other than tetramethylene glycol and ethylene glycol, for example, trimethylene glycol, 1,5-pentanediol, 1,6-hexanediaol, diethylene glycol, 1,4-cyclohexanediol or 1,4-cyclohexanedimethanol as the glycol component.

In the case of copolymerizing the above components, the copolymerizing amount is preferably less than 40 mol %, more preferably less than 20 mol % based on the total glycol component (excluding the component (C4)).

The polyether ester block copolymer is copolymerized with a poly(alkylene oxide) glycol component (C4), and the copolymerizing amount of the component (C4) is preferably 40 to 80% by weight, more preferably 40 to 70% by weight based on the total glycol component (including the component (C4)). The use of the component (C4) within the above range is effective to attain an especially good antistatic performance and suppress the welding and agglutination of the polymer to eliminate the process troubles.

The poly(alkylene oxide) glycol component (C4) is preferably a component expressed by the following formula (I)

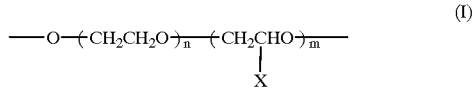

(I)

In the formula (I), X is hydrogen atom (—H) or a substituent selected from —CH$_3$, —CH$_2$Cl, —CH$_2$Br, —CH$_2$I and —CH$_2$OCH$_3$.

The use of a complicate group other than the above examples as the group X is undesirable because the increase of the polymerization degree of the copolymerized polymer becomes difficult owing to steric hindrance. A polymer having a halogen atom or an alkoxy group directly bonded to the main chain of a polyethylene glycol unit as a substituent is also undesirable because of high decomposition tendency of the polymer. The group X is preferably hydrogen atom.

In the above formula (I), n and m preferably satisfy the formulas n≧0, m≧0 and 120≧(n+m)≧20. When the value of (n+m) is smaller than 20, the blocking degree of the block copolymer is lowered and the antistaticity becomes insufficient. On the contrary, when the value of (n+m) is larger than 120, the polymerization degree is lowered, the production of a copolymer having sufficiently high polymerization degree becomes difficult and, furthermore, the antistaticity is lowered to an undesirable level. When the value of m is 2 or more, the above X groups may be same or different. The poly(alkylene oxide) glycol component may be a random copolymer or a block copolymer in itself.

In the present invention, the compounding amount of the antistatic polymer (C) is 5 to 200 parts by weight, preferably 5 to 100 parts by weight, more preferably 5 to 30 parts by weight based on 100 parts by weight of the thermoplastic resin. When the amount of the antistatic polymer exceeds 200 parts by weight, the mechanical strength and the productivity are lowered and when it is less than 5 parts by weight, the half-life period of static voltage is increased and a sufficient antistatic performance cannot be attained. When a resin composition free from the antistatic polymer (C) is used as a transportation jig of electronic field, the variation of antistaticity is developed on the surface of the transportation jig.

<Transportation Jig>

In contrast with conventional resin composition, the resin composition of the present invention can remarkably decrease the variation of antistaticity, especially the antistaticity variation in a molded article.

Concretely, a transportation jig satisfying the following formulas, [formulas relating to the variations (relationship of average value, minimum value and maximum value) of the saturated static voltage and the half-life period of static voltage measured on a surface area of 125 mm long and 150 mm wide of the transportation jig under the impressed voltage of 10 KV] at the same time can be molded by the use of the resin composition of the present invention.

$$E_{max}(V)-100(V) \leq E_{ave}(V) \leq E_{min}(V)+100(V)$$

$$T_{max}(s)-5(s) \leq T_{ave}(s) \leq T_{min}(s)+5(s)$$

(wherein $E_{ave}$, $E_{max}$ and $E_{min}$ are the average value, the maximum value and the minimum value of saturated static voltage, respectively, and $T_{ave}$, $T_{max}$ and $T_{min}$ are the average value, the maximum value and the minimum value of half-life period of static voltage, respectively).

The above relational formulas are valid in the case of measuring on nine or more points on the surface area of 125 mm long and 150 mm wide of the measuring object. The formulas should be valid on arbitrary plane part of the surface area of the measuring object, i.e. the surface of the resin constituting the transportation jig.

The above characteristics have an effect for remarkably decreasing the adhesion of suspending particles by electrostatic force over the whole surface of the transportation jig to decease the defect of appearance and shape (so-called pattern defect) caused by particles.

The resin composition of the present invention is suitably usable especially as a silicon wafer carrier among transportation jigs of electronic field. In this case, the silicon wafer carrier can be provided with at least one groove for holding a silicon wafer.

<Additives>

The resin composition of the present invention may be incorporated with a polycarbonate to decrease the shrinkage of the molded article. The shrinkage improving effect cannot be attained when the addition amount is too small and a problem of the deterioration of chemical resistance may occur according to the use when the amount is too much and, accordingly, the addition amount of the polycarbonate is adjusted to preferably 1 to 200 parts by weight, more preferably 3 to 90 parts by weight based on 100 parts by weight of the thermoplastic resin (A).

The resin composition of the present invention may be further incorporated with various additives e.g. a mold-releasing agent such as montanic acid wax, polyethylene wax and silicone oil, a flame retardant, a flame-retarding assistant, a thermal stabilizer, an ultraviolet absorber, a pigment or a dye within a range not to damage the object of the present invention.

A thermosetting resin such as phenolic resin, melamine resin, silicone resin or epoxy resin may be added to the composition within a range not to damage the object of the present invention.

Furthermore, the resin composition may be incorporated with fillers such as talc, kaolin, wollastonite, clay, silica, sericite, titanium oxide, metal powder, glass bead, glass balloon, glass flake, glass powder and glass fiber within a range not to damage the object of the present invention.

<Process for the Production of the Composition>

The resin composition of the present invention can be produced by compounding the component (A) with the component (B) and the component (C) by arbitrary compounding method. Usually, these components are preferably dispersed uniformly as far as possible and the whole or a part of the components are preferably dispersed at the same time or in uniform state. It can be achieved by simultaneously or separately mixing and homogenizing the whole or a part of the above components with a mixing machine such as blender, kneader, Banbury mixer, roll mill or extruder.

As an alternative, a resin composition dry-blended beforehand is melted, kneaded and homogenized with a heated extruder, extruded in the form of a strand and cut to desired length to obtain pellets.

The resin composition of the present invention can be molded e.g. by injection molding and used as a transportation jig of electronic field such as a silicon wafer carrier.

The polymer used in the Examples is a copolymer obtained by the Synthetic Example 1. The copolymer obtained by the Synthetic Example 1 is referred to as TRB-EKV hereafter. The surface resistivity of TRB-EKV was $1 \times 10^{10} \Omega$.

TABLE 1

| | Charged components for polymerization | | | | | | |
|---|---|---|---|---|---|---|---|
| | Acid | Glycol component | | | | | |
| | component DMT/DMI | TMG/EG | (Modified) PEG | | | | TMG + EG/ (modified) |
| Synthetic Examples | (molar ratio) | (molar ratio) | Substituent (—X) | m | n | m + n | PEG (wt. ratio) |
| 1 | 85/15 | 130/10 | —H | 85 | 0 | 85 | 45/55 |
| 2 | 85/15 | 130/10 | —CH$_2$Cl | 72 | 9 | 81 | 40/60 |
| 3 | 85/15 | 132/8 | —CH$_3$ | 80 | 8 | 88 | 50/50 |
| 4 | 85/15 | 131/9 | —CH$_2$OCH$_3$ | 80 | 8 | 88 | 50/50 |

TABLE 2

| | Acid | Glycol component | | | | | | Polyether ester block copolymer | |
|---|---|---|---|---|---|---|---|---|---|
| | component DMT/DMI | TMG/EG | (Modified) PEG | | | | TMG + EG/ (modified) | | |
| Synthetic Examples | (molar ratio) | (molar ratio) | Substituent (—X) | m | n | m + n | PEG (wt. ratio) | IC (dl/g) | Tm (° C.) |
| 1 | 85/15 | 95/5 | —H | 85 | 0 | 85 | 45/55 | 1.24 | 171 |
| 2 | 85/15 | 95/5 | —CH$_2$Cl | 72 | 9 | 81 | 40/80 | 1.27 | 172 |
| 3 | 85/15 | 96/4 | —CH$_3$ | 80 | 8 | 88 | 50/50 | 1.18 | 178 |
| 4 | 85/15 | 95.5/4.5 | —CH$_2$OCH$_3$ | 80 | 8 | 88 | 50/50 | 0.95 | 191 |

DMT: Dimethyl terepthalate
DMI: Dimethyl isophthalate
TMG: Tetramethylene glycol
EG: Ethylene glycol
PEG: Polyethylene glycol

EXAMPLES

The present invention is explained in more detail by the following Examples.

1. Raw Materials

The following materials were used as raw materials.

Polyether Ester Block Copolymers 1 to 4

A reactor was charged with dimethyl terephthalate, dimethyl isophthalate, tetramethylene glycol, ethylene glycol, a (modified) polyethylene glycol and a catalyst consisting of tetrabutyl titanate (0.090 mol % based on the acid component) at ratios to get the composition described in the Table 1 and esterification reaction was carried out at the inner temperature of 190° C. When the amount of distilled methanol reached about 80% of the theoretical value, the temperature increase of the system was started and polycondensation reaction was carried out while gradually reducing the pressure. The reaction was continued at 240° C. for 200 minutes after the vacuum degree of the system reached 1 mmHg or below. The reaction was finished by adding an antioxidant Irganox 1010 in an amount of 5% by weight based on the polyethylene glycol or the modified polyethylene glycol. The composition of the purified polymer is shown in the Table 2.

Polybutylene Terephthalate (PBT)
  Manufactured by TEIJIN Limited, TRB-QK
Polycarbonate (PC)
  Manufactured by Teijin Chemicals Ltd., AD5509
Acrylonitrile/butadiene/styrene Copolymer (ABS)
  Manufactured by Asahi Chemical Ind. Co., Ltd., Stylac 101
Polymer-type Antistatic Agent
  Manufactured by Mitsui DuPont Chemical, SD 100
  Surface resistivity: $1 \times 10^8 \Omega$
  Melting point: 92° C.
Polyether Ester Amide (PEEA)
  Manufactured by Sanyo Chemical Industries, Ltd., Pelestat 6321
  Surface resistivity: $1 \times 10^9 \Omega$
  Melting point: 203° C.
Carbon Fiber (CF)
  Manufactured by Toho Rayon Co., Ltd., HTA-C6-SR
  Volume resistivity: $1.5 \times 10^{-3}$ $\Omega$cm
  Fiber diameter: 7 $\mu$m, Fiber length: 6 mm
Ultrafine Vapor-grown Carbon Fiber (VGCF1)
  Manufactured by Hyperion Catalysis Int., U.S.A.
  Micrographite fibril BN1100
  Volume resistivity: $1 \times 10^{-2}$ $\Omega$cm
  Fiber diameter: 15 nm, Fiber length: 10 to 20 $\mu$m Ultrafine Vapor-grown Carbon Fiber (VGCF2)
  Manufactured by Showa Denko K.K., VGCF
  Volume resistivity: $1.0 \times 10^{-2}$ Ωcm
  Fiber diameter: 0.2 μm, Fiber length : 20 μm
Transesterification Preventing Agent
  Manufactured by Wako Pure Chemicals Industries, Ltd.
  DL-malic acid
2. Antistaticity (Resistivity, Saturated Static Voltage and Half-life Period of Static Voltage)
  The antistaticity was evaluated by the saturated static voltage and the half-life period of static voltage determined by using Honest Meter (manufactured by Shishido Static Co., Ltd., Static H-0110) under the impressed voltage of 10 KV (distance between electrodes of specimen: 20 mm) and the surface resistivity determined by using an Ultra-insulation tester (manufactured by Toa Electronics Ltd., SM-10E).
  The determination of low resistivity was performed in conformity with JIS K7194.
  The half-life period and the surface resistivity were measured in an atmosphere having environmental temperature of 23° C. and relative humidity of 50% after conditioning the specimen in an atmosphere of 23° C. and 50% relative humidity for 24 hours.
  The variations of saturated static voltage and half-life period of static voltage were also measured on each small section formed by dividing a specimen (125×150 mm, about 5 mm thick) into 9 sections (lengthwise and crosswise into 3×3 sections).
  FIG. 1 shows the flow direction of the resin composition in the molding of the test specimen and the divided sections in the evaluation of the antistaticity of the specimen.
3. Volume Resistivity of Fibrous Conductive Filler
  The volume resistivity was measured in conformity with JIS R-7601. When the method was inadequate for the specimen, the conductivity was measured by compressing the powder under a pressure of 100 kg/cm$^2$.
4. Surface Resistivity of an Antistatic Polymer
  The surface resistivity was determined by using an Ultra-insulation tester (manufactured by Toa Electronics Ltd., SM-10E) under an impression voltage of 500V The measurement was performed in an atmosphere having environmental temperature of 23° C. and relative humidity of 50% after conditioning the specimen in an atmosphere of 23° C. and 50% relative humidity for 24 hours.
5. Melting Point of Antistatic Polymer
  The melting point was determined by a DSC (manufactured by T.A. Instrument Japan, Ltd.).
6. Melt Viscosity Ratio
  The melt viscosity ratio is defined by the following formula (Melt viscosity ratio)=(Melt viscosity of antistatic polymer)/(melt viscosity of thermoplastic resin)

The melt viscosity was measured at 260° C. under a shear rate of 1,000 sec$^{-1}$. The measurement was performed by using Rheograph 2002 manufactured by Goettfert Werkstoff-Pruefmaschinen GmbH, Germany.
7. Evaluation of Shrinkage Anisotropy
  The shrinkages of a molded article in the resin flow direction and the direction perpendicular to the flow direction were measured by using a three-dimensional tester FJ604 (manufactured by Mitutoyo Corp.), and the anisotropy was evaluated by calculating the ratio of (shrinkage in perpendicular direction)/(shrinkage in flow direction). The anisotropy is smaller when the ratio is closer to 1.

EXAMPLES 1 TO 6 AND COMPARATIVE EXAMPLES 1 to 3

Various kinds of raw materials were homogeneously dry-blended beforehand at ratios described in the Tables 5 and 7, melted and kneaded with a vented twin screw extruder having a screw diameter of 44 mm at a cylinder temperature of 180 to 310° C., a screw rotational speed of 160 rpm and an extrusion rate of 40 kg/hr and the thread extruded through a die was cooled and cut to obtain pellets for molding.

A silicon wafer carrier was produced from the pellet by injection molding under an injection pressure of 750 kg/cm$^2$, an injection rate of 70 cm$^3$/sec, a cooling time of 15 sec and a total molding cycle of 25 sec. The side face of the silicon wafer carrier was cut to a necessary size and subjected to the above evaluation.

Antistatic agents used in the experiments are shown in the Tables 3 and 4. The antistatic agents dispersed in the form of net or stripes to get good antistaticity and thermal stability by the addition to PBT or ABS were antistatic polymers PEEA and TRB-EKV among the above antistatic agents.

TABLE 3

| Antistatic polymer | Melt viscosity (PA · S) at 260° C. and 1,000 sec$^{-1}$ | Melt viscosity ratio to TRB-QK | Melting point (° C.) |
| --- | --- | --- | --- |
| PEEA | 56 | 0.30 | 203 |
| TRB-EKV | 54 | 0.30 | 171 |
| SD100 | 236 | 1.32 | 92 |

TABLE 4

| Antistatic Polymer | Melt viscosity (PA · S) at 260° C. and 1,000 sec$^{-1}$ | Melt viscosity ratio to ABS | Melting point (° C.) |
| --- | --- | --- | --- |
| PEEA | 56 | 0.34 | 203 |

The evaluation results are shown in the Tables 5 to 7.

TABLE 5

| | Example 1 | Example 2 | Example 3 | Example 4 | Example 5 | Example 6 | Comparative Example 1 | Comparative Example 2 |
| --- | --- | --- | --- | --- | --- | --- | --- | --- |
| Composition (wt %) | | | | | | | | |
| PBT | 86 | 81 | 75.8 | 80 | 45 | — | 80 | 70 |
| PC | — | — | 5 | — | — | — | — | — |
| ABS | — | — | — | — | — | 81 | — | — |
| VGCF1 | 4 | 4 | 4 | 5 | — | 4 | 5 | — |
| VGCF2 | — | — | — | — | 5 | — | — | — |
| CF | — | — | — | — | — | — | — | 30 |
| malic acid | — | — | 0.2 | — | — | — | — | — |
| TRB-EKV | 10 | 15 | 15 | — | 50 | — | — | — |
| PEEA | — | — | — | 15 | — | 15 | — | — |

TABLE 5-continued

|  | Example 1 | Example 2 | Example 3 | Example 4 | Example 5 | Example 6 | Comparative Example 1 | Comparative Example 2 |
|---|---|---|---|---|---|---|---|---|
| SD100 | — | — | — | — | — | — | 15 | — |
| Surface resistivity ($\Omega$) | 8.5E + 8 | 4.2E + 8 | 1.5E + 9 | 4.0E + 8 | 6.0E + 9 | 8.0E + 8 | (i) | 3.0E + 1 |
| Saturated voltage (KV) | 0.02 | 0.01 | 0.04 | 0.00 | 0.12 | 0.72 | (1) | 0.05 |
| Half-life period (sec) | 3.0 | 0.04 | 2.0 | 0.0 | 0.2 | 1.0 |  | 30 |

Note: (1) Evaluation was impossible because of frequent thread breakage in extrusion to fail in getting a specimen.

For example, "8.5E+8$\Omega$" means "8.5×$10^8\Omega$".

It is clear from the Table 5 that the surface resistivity of the order of $10^8$ to $10^9$ $\Omega/cm^2$ and the half-life period of static voltage of 10 sec or below were stably attainable in the system comprising a combination of VGCF1 or VGCF2 with TRB-EKV or PEEA (Examples 1 to 6) to exhibit an antistatic performance sufficient for a transportation jig of electronic field.

On the other hand, the system comprising SD100 (Comparative Example 1) was inadequate for use because of poor thermal stability and compatibility. In the system merely added with a large amount of CF (Comparative Example 2), the half-life period of static voltage was extremely long revealing poor antistaticity.

TABLE 6

|  | Example 2 | | Comparative Example 2 | |
|---|---|---|---|---|
| Divided Section | Saturated static voltage (V) | Half-life period of static voltage (sec) | Saturated static voltage (V) | Half-life period of static voltage (sec) |
| 1 | 20 | 1 | 50 | 26 |
| 2 | 10 | 0 | 40 | 57 |
| 3 | 10 | 1 | 50 | 25 |
| 4 | 10 | 1 | 50 | 28 |
| 5 | 0 | 0 | 40 | 54 |
| 6 | 0 | 0 | 50 | 23 |
| 7 | 10 | 1 | 50 | 21 |
| 8 | 0 | 0 | 20 | 6 |
| 9 | 10 | 1 | 40 | 19 |

The Table 6 shows the variation of antistatic characteristics. The variation and value of antistatic characteristics of the Example 2 are extremely small compared with the Comparative Example 2 revealing good antistatic performance.

TABLE 7

|  | Example 2 | Comparative Example 3 |
|---|---|---|
| (composition (wt %)) |  |  |
| PBT | 81 | 87.5 |
| VGCF1 | 4 | 4 |
| CF | — | 8.5 |
| TRB-EKV | 15 | — |
| Surface resistivity ($\Omega$) | 4.2E+8 | 8.0E+8 |
| (Shrinkage in perpendicular direction) ÷ (shrinkage in flow direction) before treatment | 1.2 | 2.6 |
| (Shrinkage in perpendicular direction) ÷ (shrinkage in flow direction) after annealing at 160° C. for 5 Hr | 1.0 | 3.1 |

The Table 7 shows that the antistatic characteristics of the Example 2 were comparable to those of the Comparative Example 3 and the molded article of the Example 2 was free from shrinkage anisotropy to satisfy the precision dimensional requirement and, accordingly, it is most suitable as a transportation jig for electronic field.

EFFECT OF THE INVENTION

The present invention provides a resin composition having desirable and permanent antistaticity, exhibiting excellent static charge dissipating performance and having extremely small variations of antistatic properties (saturated static voltage and half-life period of static voltage) on the surface of the molded article. The invention further provides a transportation jig for electronic field, especially a silicon wafer carrier, made of a resin composition having excellent static charge dissipating performance, giving uniform and excellent antistaticity on the surface of a transportation jig and having small shrinkage anisotropy.

BRIEF EXPLANATION OF THE DRAWING

The FIG. 1 shows a test piece (125×150 mm, about 5 mm thick) formed for the measurement of saturated static voltage and half-life period of static voltage. The saturated static voltage and half-life period of static voltage were measured on each of nine small sections (No.1 to 9) obtained by dividing the test piece lengthwise and crosswise into 3×3 sections. The arrow shows the flow-direction of the resin composition in the molding of the test piece.

Figure 1:
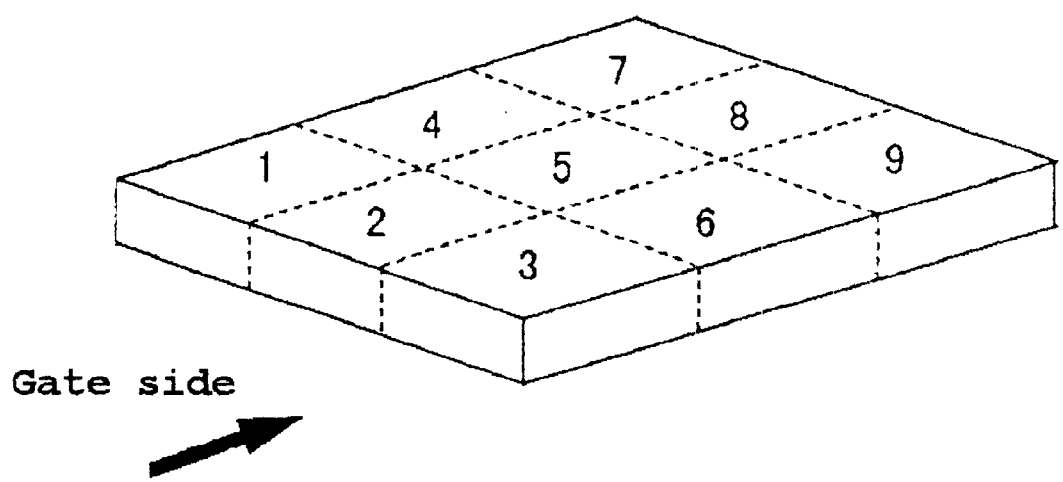

What is claimed is:

1. A resin composition produced by compounding (A) 100 parts by weight of a thermoplastic resin with (B) 1 to 30 parts by weight of a carbon fiber having a diameter of 1 nm to 1 $\mu$m, a length of 1 $\mu$m to 3 mm and a volume resistivity of smaller than 1 $\Omega$cm and (C) 5 to 200 parts by weight of an antistatic polymer having a surface resistivity of $10^8$ to $10^{11}\Omega$ (measured at the voltage of 500V), a melting point of 100° C. or above, an apparent melt viscosity of 10 to 1,000 Pa·s at apparent shear rate of 1,000 $sec^{-1}$ at 260° C. and an apparent melt viscosity ratio of the antistatic polymer, to the thermoplastic resin, of 0.01 to 1.3 under the above condition.

2. The resin composition of claim 1 wherein said carbon fiber (B) is a vapor-grown carbon fiber.

3. The resin composition of claim 1 wherein said thermoplastic resin (A) is a thermoplastic polyester.

4. The resin composition of claim 3 wherein said thermoplastic resin (A) is at least one kind of thermoplastic polyester selected from the group consisting of polybutylene terephthalate, polypropylene terephthalate, polyethylene terephthalate, polybutylene-2,6-naphthalenedicarboxylate and polyethylene-2,6-naphthalenedicarboxylate.

5. The resin composition of claim 3 wherein said thermoplastic resin (A) is polybutylene terephthalate.

6. The resin composition of claim 1 wherein said antistatic polymer (C) is one or more kinds of antistatic polymers selected from the group consisting of polyethylene glycol-based polyester amide, polyethylene glycol-based polyamide copolymer, polyethylene glycol-based polyester elastomer, polyethylene glycol methacrylate copolymer, poly(ethylene oxide/propylene oxide) copolymer and poly(epichlorohydrin/ethylene oxide).

7. The resin composition of claim 1 wherein said antistatic polymer (C) is a polyether ester block copolymer composed of (C3) a dicarboxylic acid component composed of 60 to 100 mol % of terephthahic acid component and 40 to 0 mol % of isophthalic acid component based on the total acid component, (C4) a poly(alkylene oxide) glycol component expressed by the following general formula (I)

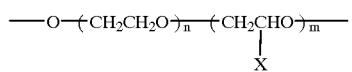

(wherein X is a substituent —H, —CH$_3$, —CH$_2$Cl—CH$_2$Br, —CH$_2$I or —CH$_2$OCH$_3$, and n and m are numbers satisfying n≧0, m≧0 and 120≧(n+m)≧20; n and m may be different when m is 2 or more; the poly(alkylene oxide) glycol component may be a random copolymer or block copolymer in itself) and (C5) a glycol component composed of 65 to 100 mol % of tetramethylene glycol and 35 to 0 mol % of ethylene glycol based on the total glycol component (excluding the component (C4)), and the copolymerized amount of the component (C4) is 40 to 80% by weight based on the total glycol component (including the component (C4)).

8. A transportation jig for electronic field molded from a resin composition described in either one of the claims 1 to 7.

9. The transportation jig of claim 8 satisfying the following formulas, (formulas relating to the variations (relationship of average value, minimum value and maximum value) of the saturated static voltage and the half-life period of static voltage measured on a surface area of 125 mm long and 150 mm wide of the transportation jig at the voltage of 10 KV) at the same time.

$$E_{max}(V)-100(V) \leq E_{ave}(V) \leq E_{min}(V)+100(V)$$

$$T_{max}(s)-5(s) \leq T_{ave}(s) \leq T_{min}(s)+5(s)$$

(wherein $E_{ave}$, $E_{max}$ and $E_{min}$ are the average value, the maximum value and the minimum value of saturated static voltage, respectively, and $T_{ave}$, $T_{max}$ and $T_{min}$ are the average value, the maximum value and the minimum value of half-life period of static voltage, respectively).

10. The transportation jig of claim 9 wherein said surface area to be measured is an arbitrary flat part on the resin surface constituting the transportation jig.

11. The silicon wafer carrier of claim 8 having at least one groove for holding a wafer.

* * * * *